United States Patent [19]

Cummins

[11] Patent Number: 5,729,144
[45] Date of Patent: Mar. 17, 1998

[54] SYSTEMS AND METHODS FOR DETERMINING LOCATION OF A FAULT ON AN ELECTRIC UTILITY POWER DISTRIBUTION SYSTEM

[76] Inventor: Kenneth L. Cummins, 7772 E. Oakwood Pl., Tucson, Ariz. 85715

[21] Appl. No.: 759,297

[22] Filed: Dec. 2, 1996

Related U.S. Application Data

[60] Provisional application No. 60/016,834 May 8, 1996.

[51] Int. Cl.$^6$ .................................................. G01R 31/08
[52] U.S. Cl. ........................ 324/535; 324/536; 324/72; 340/870.11; 340/870.16
[58] Field of Search ............................ 324/72, 501, 509, 324/512, 525, 535, 536; 340/600, 601, 870.05, 870.11, 870.13, 870.14, 870.16

[56] References Cited

U.S. PATENT DOCUMENTS

| | | | |
|---|---|---|---|
| 3,608,533 | 9/1971 | Pardis | 324/535 |
| 3,670,240 | 6/1972 | Maranchak et al. | 324/535 |
| 3,781,665 | 12/1973 | Gale | 324/533 |
| 3,878,460 | 4/1975 | Nimmersjo | 324/520 |
| 4,110,684 | 8/1978 | Gale | 324/522 |
| 4,165,482 | 8/1979 | Gale | 324/523 |
| 4,475,079 | 10/1984 | Gale | 324/523 |
| 4,672,321 | 6/1987 | Howell | 324/326 |
| 4,719,580 | 1/1988 | Nimmersjo | 364/483 |
| 4,731,688 | 3/1988 | Nimmersjo et al. | 361/65 |
| 4,731,689 | 3/1988 | Nimmersjo et al. | 361/66 |
| 4,797,805 | 1/1989 | Nimmersjo | 364/481 |
| 4,800,509 | 1/1989 | Nimmersjo | 364/492 |
| 4,841,304 | 6/1989 | Richard et al. | 324/72 X |
| 5,070,537 | 12/1991 | Ohira et al. | 455/67 |
| 5,138,265 | 8/1992 | Kawamura et al. | 324/535 |
| 5,146,170 | 9/1992 | Ishikawa et al. | 324/536 |
| 5,157,334 | 10/1992 | Lowther | 324/501 |
| 5,256,976 | 10/1993 | Ishikawa et al. | 324/522 |
| 5,319,311 | 6/1994 | Kawashima et al. | 324/534 |
| 5,321,632 | 6/1994 | Otsuji et al. | 364/562 |
| 5,508,619 | 4/1996 | Ozawa et al. | 324/535 |

OTHER PUBLICATIONS

Gale et al., "Overhead Line Fault Location Based on Travelling Waves & GPS", pp. II-7.1 thru II-7.13 Date of Article Unknown.

Cummins, Kenneth L. et al. "Line Reliability and Fault Analysis Using the National Lightning Detection Network", Dated Oct. 27-29 1993.

*Primary Examiner*—Glenn W. Brown
*Attorney, Agent, or Firm*—LaRiviere, Grubman & Payne

[57] ABSTRACT

A power line fault locating system employing combinations of conducted electrical transient signals recorded at specific points in the power delivery network, radiated electromagnetic signals produced by the air-gap arc preceeding the fault current or by the lightning discharge causing the fault, and knowledge of the power line path associated therewith. The arrival time of conducted transient signals produced by the fault are detected with microsecond accuracy through use of a fault recording sensor (FRS). The low level electromagnetic radiation (VHF/UHF) caused by arcing associated with power line faults is detected at at least one arc detection sensor (ADS) located at some distance from the power line. The ADS senses the time of arrival of the radiated signal associated with the fault. These two sensors for detecting the conducted and radiated signals are coupled to a central power line fault locating analyzer (PLFLA) that receives and manipulates the information using appropriate algorithms and databanks containing geographical maps of electric utility power systems, to arrive at the power line fault location. In an alternative system embodiment, multiple ADS units located about a power distribution network determine the time of arrival of arcing information which is communicated to the PLFLA to determine the power line fault location. In a related system, the precise time of occurrence of a lightning discharge associated with a lightning-caused power line fault is combined with the arrival time of conducted signals from at least one FRS and communicated to a PLFLA.

18 Claims, 3 Drawing Sheets

SYSTEMS AND METHODS FOR DETERMINING LOCATION OF A FAULT ON AN ELECTRIC UTILITY POWER DISTRIBUTION SYSTEM

RELATED APPLICATION

This application is related to co-pending Provisional patent application Ser. No. 60/016,834, entitled: "SYSTEMS AND METHODS FOR DETERMINING LOCATION OF A FAULT ON AN ELECTRIC UTILITY POWER DISTRIBUTION SYSTEM", filed May 8, 1996 by the same applicant.

FIELD OF THE INVENTION

The present invention relates to systems and methods for improving the accuracy of locating faults on electric utility power distribution systems. More particularly, the present invention pertains to systems and methods that utilize conducted and radiated signals to locate faults on electric utility power distribution systems. Even more particularly, the present invention relates to power line fault locating systems and methods that utilize traveling conducted wave technology, precise timing means, and electromagnetic signal detection means, including lightning location technology, to locate faults on a power distribution system.

DESCRIPTION OF THE PRIOR ART

Electric power outages are very often attributed to faults that trigger protective devices in the power distribution system. The faults result because of the creation of a low impedance, current conducting path between a power line and another power line, or a power line to ground, or a power line to the neutral line. The current being conducted is termed fault current and is typically preceded by an air gap arc which results from voltage levels which exceed the local insulation level. Such arcs typically result from lightning striking the line, tree branches blowing near the line, birds or small animals bridging the insulation gap, or cracked/dirty insulators. The distribution system's protective devices are designed to sense the fault current and to switch relays to operate circuit breakers in an attempt to clear the fault. If the fault can be cleared, then finding the location of the fault is typically not of high concern, however, if the fault is intermittent, or re-occurring, then locating the fault is of greater concern. Locating the fault becomes of extreme concern when the fault can not be cleared, i.e a "bolted" or "lock-out" condition exists and the fault source mast be found.

One method of locating the fault is line-men (persons) walking/driving/flying along the line until the source of the fault is found. Obviously, if the fault occurs along distribution lines in urban areas, then the flying method is not practical. In these situations, the faults can be isolated by means of evaluating the incoming telephone calls of the customers. If the faults occur in less populated areas, then more scientific methods are required to locate the fault.

The state of the art in fault locating systems (FLS), employs recording site sensors that are responsive to conducted voltage transient/current transient signals produced by the fault. The fault locating methods are referred to as either impedance (reactance) or traveling wave/time of arrival methods. The impedance method analyzes the impedance characteristics of a power line by comparing normal loading conditions against the abnormal line impedance resulting from a fault. The traveling wave method, (see FIG. 1), utilizes the fact that a transient waveform is generated and conducted away from a fault F at time T0. The fault waveforms propagate in opposite directions, along line L1, L2 from the fault with respective propagation times Tp1, Tp2. Knowledge of the times of arrival, T1,T2, at opposing measuring equipment, and characteristics about the line being monitored help in determining the distance that the wave has travelled from the location of the fault.

While these conducted transient methods have merits in a single stretch of transmission lines, an element of ambiguity is introduced when there are multiple primary circuits or tap points as in a distribution subsystem, since any one of the circuit paths could have been the source of the fault at the same distance determined. The traveling wave (voltage transient/current transient) method has been published by P. F. Gale of Hathaway Instruments Ltd, England, in a paper entitled: "OVERHEAD LINE FAULT LOCATION BASED ON TRAVELING WAVES & GPS", and by H. Lee of B. C. Hydro and Power Authority, Burnaby, B. C. in a paper entitled "DEVELOPMENT OF AN ACCURATE TRAVELLING WAVE FAULT LOCATOR USING THE GLOBAL POSITIONING SYSTEM SATELLITES".

There are several known prior art patents relating to fault locating system, these include U.S. Pat. Nos. 3,670,240, 3,781,665, 3,878,460, 4,110,684, 4,165,482, 4,475,079, 4,672,321, 4,719,580, 4,731,689, 4,731,688, 5,256,976, 4,800,509, 5,146,170, 5,070,537, 5,256,976, 5,319,311, 5,321,632, and 5,508,619. Of general interest is the teachings of U.S. Pat. Nos. 5,070,537 and 5,508,619 which teach conducted voltage surge detection and the utilization of GPS (Global Positioning System) technology to determine the distance to the fault, respectively. U.S. Pat. No. 5,256,976 teaches the use of a plurality of electromagnetic wave detectors disposed within metal containers and which detect electromagnetic waves generated by a fault within a container to aid in locating a power line fault. Each bus in a power line network has a detector which reports electromagnetic wave fault data only for that bus. The electromagnetic wave detectors taught by U.S. Pat. No. 5,256,976 do not utilize synchronized time of arrival technology in its system. None of the prior art patents teach an improved electric power line fault locating system that utilizes both conducted signal information and electromagnetic radiated signal information, in combination with GPS technology and geographical information about the line to locate a fault on a power distribution line.

Thus, there is a need to improve the accuracy of fault locating systems, especially when applied to distribution subcircuits where it is not practical to include a sufficient number of conducted waveform monitoring sites to provide unambiguous fault locations. However, it is known that power line faults generate low level electromagnetic radiated signals caused by arcing. To applicant's knowledge, power line fault locating systems have not fully employed this radiated electromagnetic signal detection (arc detection) for locating a fault, as described below.

It is therefore an object of the present invention to provide an improved electric power line fault locating system that utilizes both conducted signal information and electromagnetic radiated signal information, in combination with geographical information about the line to locate a fault on a power distribution line.

An additional object of the present invention is to provide an improved electric power line fault locating system that utilizes conducted signal information (such as the traveling wave systems and methods currently known) and electromagnetic radiated signal information (precise time and location) produced by lightning locating systems, to locate faults on a power line which are produced by a lightning stroke on or near the line.

A related object of the present invention is to provide an improved electric power line fault locating system that utilizes both conducted signal information and electromagnetic radiated signal information using electronic arc detection sensors (ADS) adapted to detect low level electromagnetic radiation (VHF,UHF) generated by arcing associated with faults on a power distribution line.

Another related object of the present invention is to provide an improved electric power line fault locating system that utilizes only electromagnetic radiated signal information using a plurality of electronic arc detection sensors (ADS) adapted to detect low level electromagnetic radiation (VHF,UHF) generated by arcing associated with faults on a power distribution line.

SUMMARY OF THE INVENTION

Accordingly, in a lightning caused power line fault locating system, the foregoing objects are accomplished by employing lightning locating systems (LLS) and a fault recorder sensor (FRS) as is employed in a traveling wave fault locating system (TWFLS), both coupled to a central power line fault locating analyzer (PLFLA) that receives and manipulates lightning location information and conducted power line fault information to determine the location of the fault. The LLS being responsive to high level electromagnetic radiated fields generated by the lightning discharge and capable of recording, to a microsecond level, the time of occurrence of the lightning stroke, as well as being capable of locating the lightning stroke with a known accuracy. The FRS provides the time of arrival, also to the microsecond level, of the conducted travelling wave generated by the fault. The information from the LLS and FRS is further manipulated at the PLFLA using appropriate algorithms and databanks containing geographical maps of electric utility power systems to arrive at the location of the power line fault. The LLS provides the initial time of the fault-producing lightning discharge, so that only one FRS needs to be employed.

In a power line fault locating system, for either lightning or non-lightning caused faults, in addition to a FRS, a modified electronic version of the sensors used in a LLS system is employed. The modified sensors, termed arc detection sensors (ADS), being responsive to low level electromagnetic radiation (VHF/UHF) caused by arcing associated with a fault. At least one ADS being positioned at a predetermined location to sense the time of arrival of the radiated arc associated with a fault on a power line. The time of arcing information from the ADS and the time of arrival of the conducted signal from the FRS being communicated to the PLFLA for further manipulation, using appropriate algorithms and databanks containing geographical maps of electric utility power systems to arrive at the location of the power line fault.

In an alternative embodiment, multiple ADS units located about a power distribution network are provided such that the time of arcing information, from each of the ADS units, is communicated to the PLFLA to provide sufficient information to determine the exact location of a power line fault employing time-of-arrival location methods similar to those employed in lightning locating systems, see paper by Kenneth L. Cummins, et al., entitled "LINE RELIABILITY AND FAULT ANALYSIS USING THE NATIONAL LIGHTNING DETECTION NETWORK", presented October 1993 at the Precise Measurement Power Conference, Arlington, Va. The PLFLA contains longitudinal and latitudinal information on each ADS as well as the geographical map of the power distribution system. The ADS type of power line fault locating system being entirely based on arc detection and does not require input from a FRS to determine the location of a fault.

The foregoing objects and features of the present invention will become more apparent from the following disclosure of the invention, such disclosure describing, byway of illustration, only the preferred embodiments of the invention. As will be realized, the invention is capable of other embodiments without departing from the invention. Accordingly, the drawings and descriptions will be regarded as illustrative in nature and not as restrictive.

DESCRIPTION OF THE INVENTION

Figure 1:
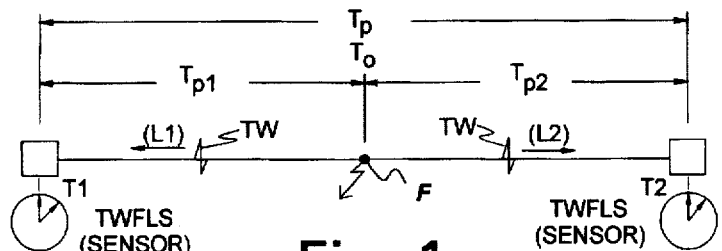
FIG. 1 is a diagram illustration of a fault locating system arrangement for implementing the travelling wave method of locating a fault on a power line.
Figure 2:
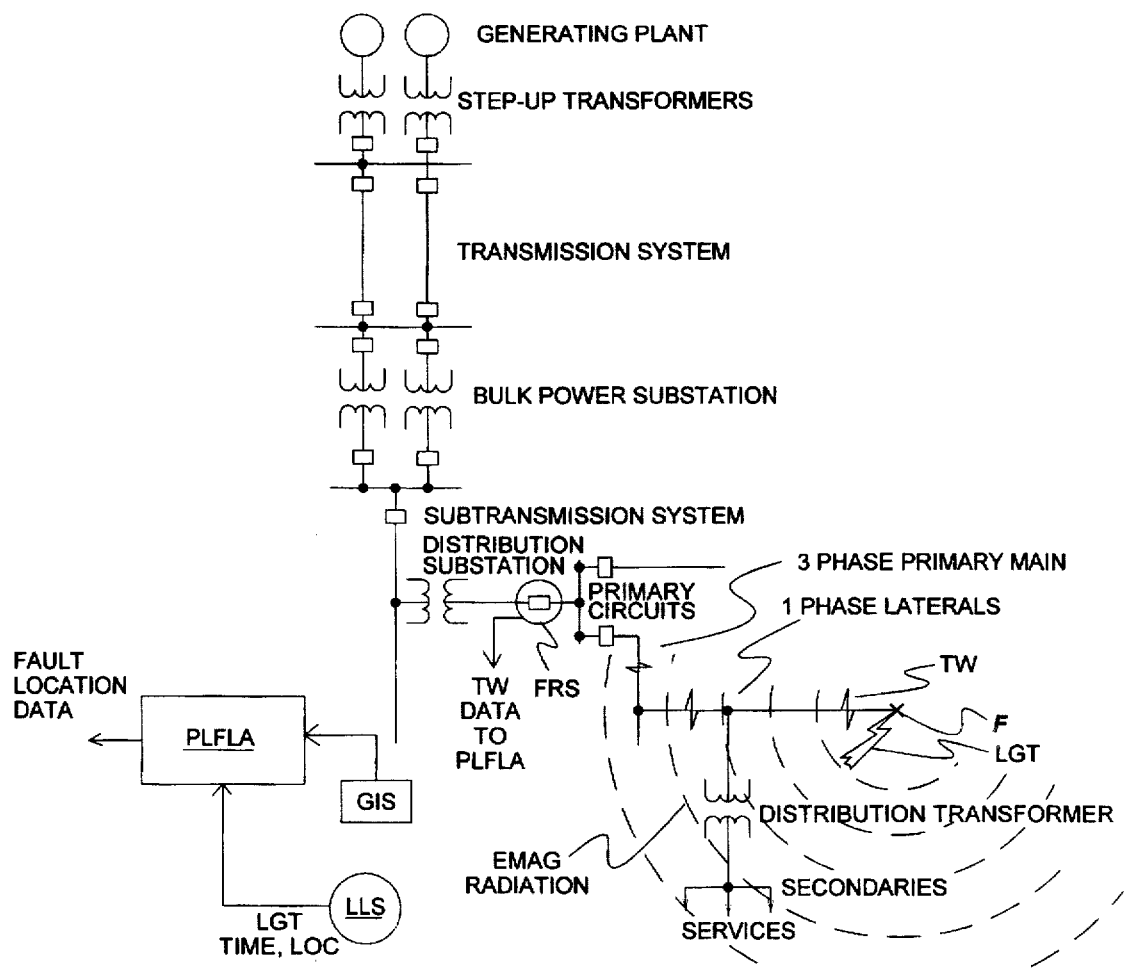
FIG. 2 is a diagrammatic representation of a lightning caused fault on a power distribution system and a fault locating system employing a electronic lightning locating system (LLS), a fault recorder sensor (FRS) responsive to the conducted fault waveform, a geographical information system (GIS) providing information about the location of the power lines, and a power line fault locating analyzer (PLFLA) in accordance with the present invention.

FIG. 2 shows a diagrammatic representation of a fault on a power distribution system and a fault locating system employing an electronic lightning locating system (LLS), a fault recording sensor (FRS) responsive to conducted fault waveforms, and a power line fault locating analyzer (PLFLA) in accordance with the present invention. The LLS detects and processes the electromagnetic radiation produced by a lightning discharge and communicates the relevant lightning information (precise time and location) to the PLFLA, to be combined with the arrival time of the conducted signal recorded by the FRS, also communicated to the PLFLA. This conducted signal will contain a waveform produced by the lightning discharge, preceded by, or followed, in rapid succession by a waveform produced by the resulting fault current. Frequently, these two waveforms will be indistinguishable, as the location of the lightning discharge may also be the precise location of the fault along the line. Critical to the manipulation of the information is that both the LLS and FRS record the time of their respective events being monitored to microsecond accuracy. In this embodiment, the precise timing is provided by clocks which are, by example, synchronized by Global Positioning System (GPS) receivers. The use of an LLS to determine the precise time of the lightning discharge eliminates having to employ a FRS at more than one location along the distribution line. As a first step in the location procedure, the path length between the FRS and the fault is determined by using the time of arrival at a FRS monitoring site of the conducted wave induced by a lightning on a power line, and the time of the lightning event as determined by a lightning location system (LLS), coupled with specific knowledge of the placement/path of related power lines as provided by a properly configured geographical information system (GIS). In cases involving multiple tap points along the line, more than one location will be consistent with the determined path length. This ambiguity will commonly be resolved with knowledge of the approximate location of the lightning and its estimated location error, as provided by the LLS.

An additional feature of this method is that if the fault occurs at a point farther from the FRS than does the lightning discharge, it is possible to locate both the lightning stroke point and the fault location. This provides additional information about the insulation level of the line and identifies weak points along the line.

Figure 3:
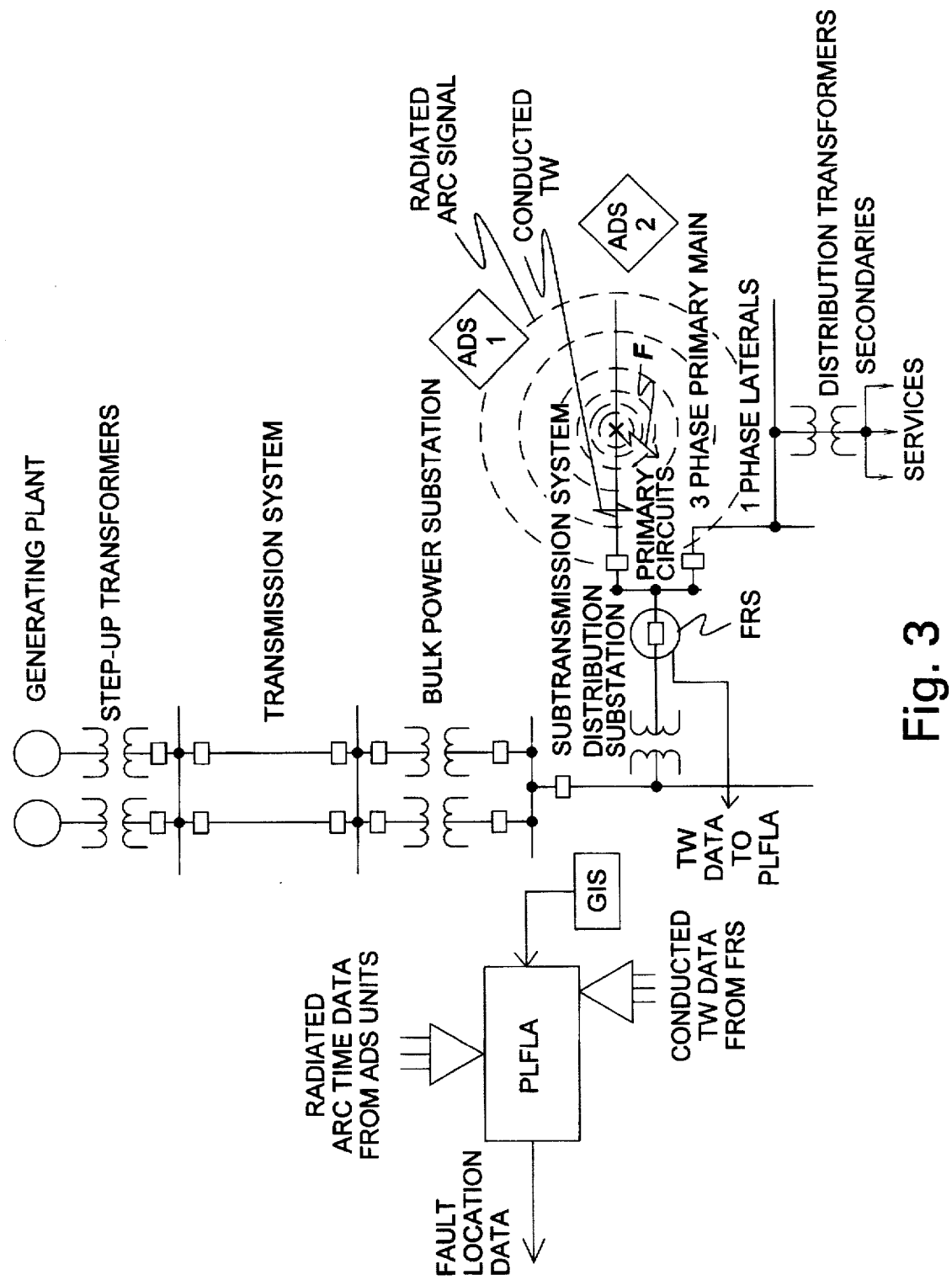
FIG. 3 is a diagrammatic representation of a fault on a power distribution system and a fault locating system employing a pair of arc detection sensors (ADS) in addition to a fault recorder sensor (FRS) responsive to the conducted fault waveform, and a power line fault locating analyzer (PLFLA) in accordance with the present invention.

FIG. 3 is a diagrammatic representation of a fault on a power distribution system and a fault locating system employing a pair of arc detection sensors (ADS) in combination with a fault recording sensor (FRS) and a power line fault locating analyzer (PLFLA) in accordance with the present invention. This embodiment employs electronic circuitry in the ADS that is responsive to the arc that emits low level electromagnetic radiation, and which determines the arrival time of the electromagnetic radiation at each ADS. While primarily designed for detecting the arc associated with faults, the ADS may also include circuitry for detecting lightning discharges.

The information concerning the time of the arc detected by the ADS, in combination with the information concerning the time of arrival of the conducted traveling wave sensed by the FRS and the associated line pathway provided by the GIS are sufficient for determining the location of the fault. Upon the occurrence of a fault, the arc will generate a radiated signal, and the arrival times of this radiated signal is recorded at each of the ADS detectors. In the case where only one ADS detects the arc, the location of the fault on the line is determined using a procedure which iteratively moves an estimated fault location along the line, and computes the expected arrival time at both the ADS and the FRS sites, using the geographical information. Since the conducted signal must propagate along the power line, and the radiated signal must travel a straight-line path between the arc and the ADS, a unique solution can be obtained. In the case where two ADS sensors detect the arc, the difference in arrival times of the radiated waveform at the two ADS sites is used to determine a hyperbola that is symmetrical about a line drawn between the two ADS. The point of intersection between the power line and this hyperbola is the initial estimate of the fault location. This estimate can then be improved upon or verified by considering the arrival time of the conducted fault waveform at the FRS. Note that if the fault occurred equidistant between the two ADS detectors, then the hyperbola would be a straight line which is equidistant from both ADS sites (See Cummins et al., 1993 for a discussion of "relative time of arrival" method of hyperbolic intersections).

Figure 4:
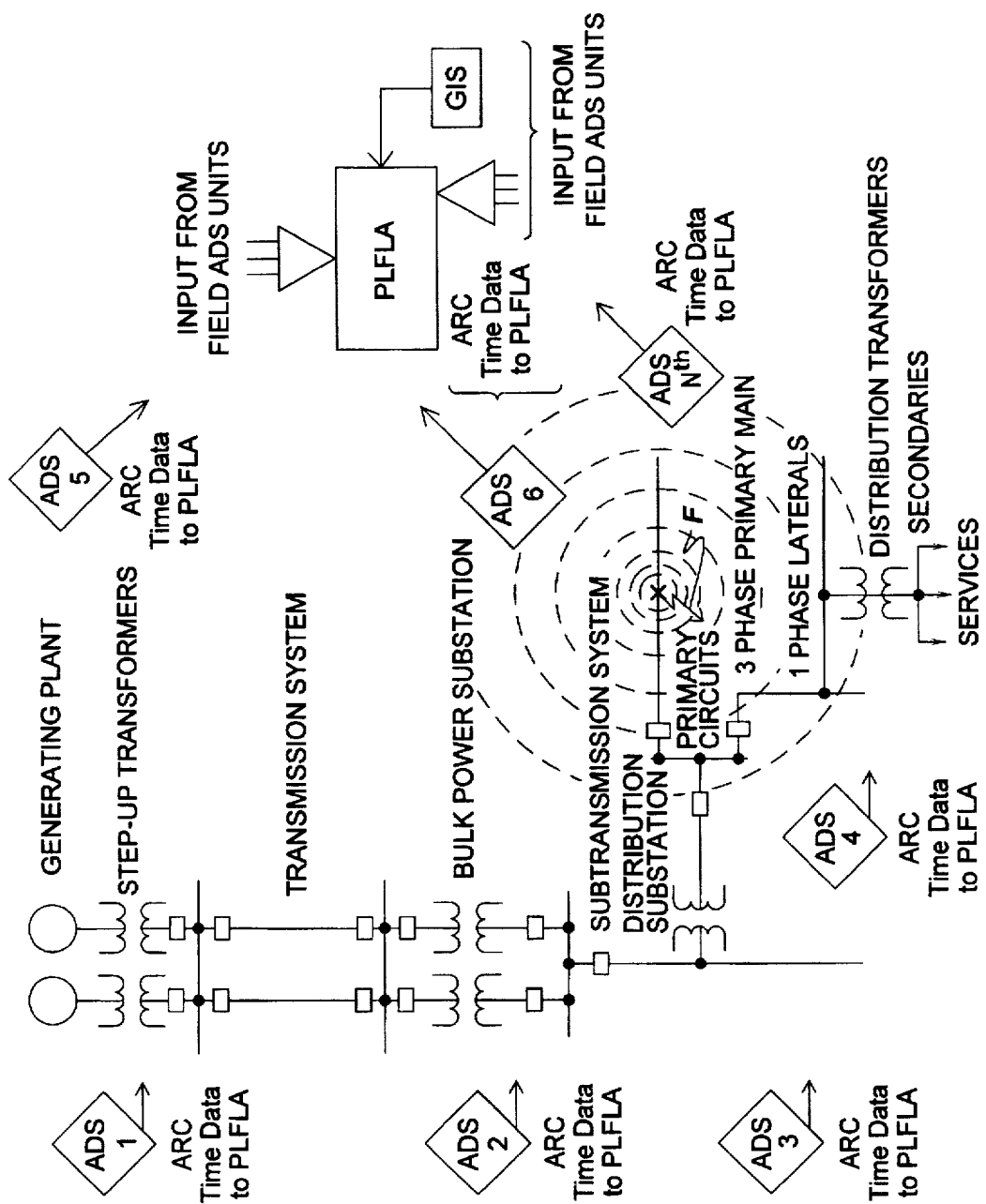
FIG. 4 is a diagrammatic representation of a fault on a power distribution system and a fault locating system employing only multiple arc detection sensors (ADS) with a power line fault locating analyzer (PLFLA) in accordance with the present invention.

FIG. 4 is a diagrammatic representation of a fault on a power distribution system and a fault locating system employing only multiple arc detection sensor (ADS) with a power line fault locating analyzer (PLFLA) in accordance with the present invention. Here, three (3) or more ADS sites about a power distribution network are provided such that the arrival time of arcing information at each of the ADS sites is communicated to the PLFLA to determine the exact location of a power line fault. The PLFLA contains longitudinal and latitudinal information on each ADS site as well as the geographical map of the power distribution system. The ADS type of power line fault location system of the present invention is based entirely on arc detection and does not require input regarding the conducted waveform to determine the location of a fault.

While the present invention has been shown and described herein in what is believed to be the most practical and preferred embodiments, it is recognized that departures can be made there from within the scope of the invention.

I claim:

1. A power distribution line fault locating system, said system comprising:

at least one first data manipulation unit for manipulating conducted fault signal data resulting from a fault on a power distribution line and producing and communicating a first set of fault location data;

at least one second data manipulation unit for manipulating electromagnetic radiated signal data emanating from said fault on said power distribution line and producing and communicating a second set of fault location data; and a fault location center responsive to said first and second set of fault location data produced by said at least one first and said at least one second data manipulation units for determining a location of said fault.

2. A power distribution line fault locating system as described in claim 1, wherein:

said first set of fault location data comprises a time of arrival at said at least one first data manipulation unit of said conducted signal data generated by said fault on said power distribution line;

said second set of fault location data comprises a precise time of arrival of said electromagnetic radiated signal data emanating from said fault on said power distribution line at said at least one second data manipulation unit;

said time of arrival of said conducted signal data and said time of arrival of said electromagnetic radiated signal data being accurate to microsecond accuracy as made possible by said at least one first and said at least one second data manipulation units being provide with, and utilizing, clocks that are synchronized by Global Positioning System (GPS) receivers; and said fault location center comprises a power line fault locating analyzer, operative to determine a first path length between said at least one first data manipulation unit and said fault, and a second path length between said at least one second data manipulation unit and said fault, by utilizing (a) said time of arrival of said conducted signal data at said at least one first data manipulation unit, (b) said time of arrival of said electromagnetic radiated signal data as determined by said at least one second data manipulation unit, and (c) placement and path data of related individual power lines associated with said power distribution line as provided by a geographical information system.

3. A power distribution line fault locating system as described in claim 1, wherein:

said conducted fault signal data comprises conducted electrical signals produced by said fault; and said at least one first data manipulation unit comprises a fault recording sensor responsive to conducted electrical signal fault data for determining an impedance characteristics of said power distribution line by comparing normal loading conditions against an abnormal line impedance resulting from said fault.

4. A power distribution line fault locating system as described in claim 1, wherein:

said conducted fault signal data comprises conducted current transient signal produced by said fault; and said at least one first data manipulation unit comprises a fault recording sensor responsive to said conducted current transient signal for determining its time of arrival data, said conducted current transient signal being one of a plurality of traveling wave signals that travel in opposite directions from a location of said fault.

5. A power distribution line fault locating system as described in claim 1, wherein:

said electromagnetic radiated signal data comprises electromagnetic radiation data generated by a lightning discharge which produces a lightning-caused fault on said power distribution line; and said at least one second data manipulation unit comprises at least one electronic lightning locating system that manipulates said electromagnetic radiation data generated by lightning and identifies a time of occurrence and a location of a stroke of lightning that caused said fault.

6. A power distribution line fault locating system as described in claim 1, wherein:

said electromagnetic radiated signal data comprises low level electromagnetic radiation (VHF,UHF) generated by arcing associated with a fault on said power distribution line; and said at least one second data manipulation unit comprises at least one electronic arc detection sensor having circuitry that detects said low level electromagnetic radiation (VHF,UHF) and that manipulates said electromagnetic radiation for purposes of determining a time of arrival of said radiation at said electronic arc detection sensor.

7. A power distribution line fault locating system, said system comprising:

at least two electronic arc detection sensors having electronic circuitry responsive to low level electromagnetic radiation (VHF,UHF) emanating from arcing at a fault on a power distribution line, said electronic circuitry manipulating said electromagnetic radiation for purposes of determining and communicating a time of arrival of said radiation at each of said at least two arc detection sensors; and a power line fault locating analyzer, operative to (a) receive said communicated time of arrival of said radiation at each of said at least two arc detection sensors, (b) manipulate stored longitudinal and latitudinal information on each of said at least two arc detection sensors, and (c) further manipulate placement and path data of related individual power lines associated with said power distribution line as provided by a geographical information system for purposes of determining an exact location of said fault.

8. A power distribution line fault locating system, said system comprising:

at least one first data manipulation unit comprising at least one fault recording sensor unit for manipulating a conducted electrical signal produced by a fault on a power distribution line, and producing and communicating a first set of fault location data, said fault recording sensor unit being responsive to said conducted electrical signal for determining its time of arrival data, said conducted electrical signal being one of a plurality of conducted traveling wave signals that travel in opposite directions from a location of said fault;

at least one second data manipulation unit for manipulating electromagnetic radiated signal data emanating from said fault on said power distribution line, and producing and communicating a second set of fault location data; and a fault location center responsive to said first and second set of fault location data produced by said at least one first and said at least one second data manipulation units for determining a location of a fault.

9. A power distribution line fault locating system as described in claim 8, wherein:

said electromagnetic radiated signal data comprises electromagnetic radiation data generated by a lightning-caused fault on said power distribution line; and said at least one second data manipulation unit comprises at least one electronic lightning locating system that manipulates said electromagnetic radiation data such that said second set of fault location data comprises a precise time of occurrence and location of lightning which produces said lightning-caused fault on said power distribution line.

10. A power distribution line fault locating system as described in claim 9, wherein:

said conducted electrical signal comprises a conducted electrical signal generated by said lightning-caused fault on said power distribution line, and said first set of fault location data comprises a time of arrival at said at least one first data manipulation unit of said lightning-caused conducted electrical signal;

said time of arrival of said lightning-caused conducted electrical signal and said time of occurrence of lightning which produces said lightning-caused fault being accurate to microsecond accuracy as made possible by said at least one first data manipulation unit and said at least one second data manipulation unit being provided with, and utilizing, clocks that are synchronized by Global Positioning System (GPS) receivers; and said fault location center comprises a power line fault locating analyzer, operative to determine a first path length between said at least one first data manipulation unit and said lightning-caused fault, and a second path length between said at least one second data manipulation unit and said lightning-caused fault, by utilizing (a) said time of arrival of said lightning-caused conducted electrical signal at said at least one first data manipulation unit, (b) said time of occurrence of lightning which produced said lightning-caused fault as determined by said at least one second data manipulation unit, and (c) placement and path data of related individual power lines associated with said power distribution line as provided by a geographical information system.

11. A power distribution line fault locating system as described in claim 8, wherein:

said electromagnetic radiated signal data comprises low level electromagnetic radiation (VHF,UHF) generated by arcing associated with a fault on said power distribution line; and said at least one second data manipulation unit comprises at least one electronic arc detection sensor having circuitry that detects said low level electromagnetic radiation and that manipulates said low level electromagnetic radiation for purposes of determining and communicating a time of arrival of said radiation at said electronic arc detection sensors.

12. A power distribution line fault locating system as described in claim 11, wherein:

said fault location center comprises a power line fault locating analyzer, operative to (a) receive said communicated time of arrival of said radiation at said at least one arc detection sensor, (b) manipulate stored longitudinal and latitudinal information on said at least one arc detection sensor, and (c) further manipulate placement and path data of related individual power lines associated with said power distribution line as provided by a geographical information system for purposes of determining an exact location of said fault.

13. A power distribution line fault locating system, said system comprising:

at least one first data manipulation unit for manipulating conducted fault signal data resulting from a fault on a power distribution line and producing and communicating a first set of fault location data;

at least one second data manipulation unit for manipulating electromagnetic radiated signal data emanating from said fault on said power distribution line and producing and communicating a second set of fault location data; and a power line fault locating analyzer, operative to determine a first path length between said at least one first data manipulation unit and said fault, and a second path length between said at least one second data manipulation unit and said fault, by utilizing (a) said communicated first set of fault location data, (b) said communicated second set of fault location data, and (c) placement and path data of related individual power lines associated with said power distribution line as provided by a geographical information system for purposes of determining a location of said fault.

14. A power distribution line fault locating system as described in claim 13, wherein:

said conducted fault signal data comprises a conducted electrical signal produced by said fault; and said at least one first data manipulation unit comprises at least one fault recording sensor unit for manipulating said conducted electrical signal, and producing and communicating said first set of fault location data, said at least one fault recording sensor unit being responsive to said conducted electrical signal for determining said conducted electrical signal's time of arrival data at said at least one first data manipulation unit, said conducted electrical signal being one of a plurality of conducted traveling wave signals that travel in opposite directions from a location of said fault.

15. A power distribution line fault locating system as described in claim 14, wherein:

said electromagnetic radiated signal data comprises electromagnetic radiation data generated by a lightning-caused fault on said power distribution line; and said at least one second data manipulation unit comprises at least one electronic lightning locating system that manipulates said electromagnetic radiation data such that said second set of fault location data comprises a precise time of occurrence and location of lightning which produced said lightning-caused fault on said power distribution line.

16. A power distribution line fault locating system as described in claim 15, wherein:

said conducted electrical signal comprises a conducted electrical signal generated by said lightning-caused fault on said power distribution line, and said first set of fault location data comprises a time of arrival at said at least one first data manipulation unit of said lightning-caused conducted electrical signal;

said time of arrival of said lightning-caused conducted electrical signal and said time of occurrence of lightning which produced said lightning-caused fault being accurate to microsecond accuracy as made possible by said at least one first data manipulation unit and said at least one second data manipulation unit being provided with, and utilizing, clocks that are synchronized by Global Positioning System (GPS) receivers; and said power line fault locating analyzer further being operative to determine a first path length between said at least one first data manipulation unit and said lightning-caused fault, and a second path length between said at least one second data manipulation unit and said lightning-caused fault, by utilizing (a) said time of arrival of said lightning caused conducted electrical signal at said at least one first data manipulation unit, (b) said time of occurrence of lightning which produced said lightning-caused fault as determined by said at least one second data manipulation unit, and (c) placement and path data of related individual power lines associated with said power distribution line as provided by a geographical information system.

17. A power distribution line fault locating system as described in claim 14, wherein:

said electromagnetic radiated signal data comprises low level electromagnetic radiation (VHF,UHF) generated by arcing associated with a fault on said power distribution line; and said at least one second data manipulation unit comprises at least one electronic arc detection sensor having circuitry that detects said low level electromagnetic radiation and that manipulates said low level electromagnetic radiation for purposes of determining and communicating a time of arrival of said radiation at said electronic arc detection sensor.

18. A power distribution line fault locating system as described in claim 17, wherein:

said power line fault locating analyzer being operative to (a) receive said communicated time of arrival of said radiation at said at least one arc detection sensor, (b) manipulate stored longitudinal and latitudinal information on said at least one arc detection sensor, and (c) further manipulate placement and path data of related individual power lines associated with said power distribution line as provided by a geographical information system for purposes of determining an exact location of said fault.

* * * * *